United States Patent
Heston et al.

(10) Patent No.: US 10,896,861 B2
(45) Date of Patent: Jan. 19, 2021

(54) HETEROGENEOUS MULTI-LAYER MMIC ASSEMBLY

(71) Applicant: Raytheon Company, Waltham, MA (US)

(72) Inventors: David D. Heston, Waltham, MA (US); John G. Heston, Waltham, MA (US); Claire E. Mooney, Waltham, MA (US); Mikel J. White, Waltham, MA (US); Jon Mooney, Waltham, MA (US); Tiffany Cassidy, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/390,659

(22) Filed: Apr. 22, 2019

(65) Prior Publication Data
US 2020/0335413 A1    Oct. 22, 2020

(51) Int. Cl.
| | | |
|---|---|---|
| *H05K 1/02* | (2006.01) | |
| *H01L 21/48* | (2006.01) | |
| *H01L 21/56* | (2006.01) | |
| *H01L 23/00* | (2006.01) | |
| *H01L 23/46* | (2006.01) | |
| *H01L 23/48* | (2006.01) | |
| *H01L 23/66* | (2006.01) | |
| *H01L 23/367* | (2006.01) | |
| *H01L 23/373* | (2006.01) | |
| *H01L 23/495* | (2006.01) | |

(Continued)

(52) U.S. Cl.
CPC ........ *H01L 23/34* (2013.01); *H01L 23/49822* (2013.01); *H01L 23/49827* (2013.01); *H01L 23/66* (2013.01); *H01L 2223/6683* (2013.01)

(58) Field of Classification Search
CPC .......... H05K 1/02; H01L 21/48; H01L 21/56; H01L 23/00; H01L 23/46; H01L 23/48; H01L 23/66; H01L 23/367; H01L 23/373; H01L 23/495; H01L 23/498; H01L 23/522; H01L 23/528; H01L 23/535; H01L 23/538
USPC .......... 361/720, 809; 333/33, 202, 230, 247; 257/275, 621, 728; 438/123
See application file for complete search history.

(56) References Cited

U.S. PATENT DOCUMENTS

| | | | | |
|---|---|---|---|---|
| 5,023,624 A | * | 6/1991 | Heckaman | ............... H01L 23/66 |
| | | | | 333/247 |
| 5,488,350 A | * | 1/1996 | Aslam | .................... H01C 7/048 |
| | | | | 219/482 |

(Continued)

OTHER PUBLICATIONS

Invitation to Pay Additional Fees from related PCT Application No. PCT/US2019/066818 dated Mar. 16, 2020.

(Continued)

*Primary Examiner* — Xiaoliang Chen
(74) *Attorney, Agent, or Firm* — Burns & Levinson, LLP; Joseph M. Maraia

(57) ABSTRACT

An HPA MMIC assembly includes a MMIC device coupled to a thermal spreader. A ground plane is provided on the thermal spreader and coupled to FETs in the MMIC device. The multiple levels of metal separated by multiple dielectric layers provide low-loss broad-band microstrip circuits. The thermal spreader may include diamond, an air/wire-edm spreader or a multi-layer board (MLB) with heat sink vias and ground vias.

9 Claims, 4 Drawing Sheets

(51) Int. Cl.
*H01L 23/498* (2006.01)
*H01L 23/522* (2006.01)
*H01L 23/528* (2006.01)
*H01L 23/535* (2006.01)
*H01L 23/538* (2006.01)
*H01L 23/34* (2006.01)

(56) References Cited

U.S. PATENT DOCUMENTS

| | | | | |
|---|---|---|---|---|
| 5,566,752 | A * | 10/1996 | Arnold | F28F 13/00 165/185 |
| 5,801,073 | A * | 9/1998 | Robbins | H01L 21/50 257/E21.499 |
| 5,834,840 | A * | 11/1998 | Robbins | H01L 21/4807 257/705 |
| 5,838,545 | A * | 11/1998 | Clocher | H01L 23/3675 361/719 |
| 6,423,982 | B2 * | 7/2002 | Nishibayashi | H01L 21/4846 257/328 |
| 6,549,105 | B2 * | 4/2003 | Takahashi | H01P 1/20363 257/664 |
| 6,778,041 | B2 * | 8/2004 | Takahashi | H01P 1/20363 333/202 |
| 7,002,511 | B1 * | 2/2006 | Ammar | G01S 7/032 342/118 |
| 8,143,654 | B1 * | 3/2012 | Saunier | H01L 21/8206 257/275 |
| 8,609,461 | B1 * | 12/2013 | Balakrishnan | H01L 21/02376 257/615 |
| 8,908,383 | B1 | 12/2014 | Railkar et al. | |
| 9,318,450 | B1 * | 4/2016 | Reza | H01L 23/66 |
| 9,520,356 | B1 * | 12/2016 | Chiesa | H01L 23/66 |
| 9,520,368 | B1 * | 12/2016 | Tonomura | H01L 23/66 |
| 2001/0017373 | A1 * | 8/2001 | Nishibayashi | H01L 23/3732 257/77 |
| 2003/0152140 | A1 * | 8/2003 | Antoniak | H04B 1/50 375/219 |
| 2004/0266056 | A1 * | 12/2004 | Ravi | H01L 23/3732 438/105 |
| 2010/0038776 | A1 | 2/2010 | Bessemoulin | |
| 2012/0063097 | A1 * | 3/2012 | Reza | H01L 23/66 361/720 |
| 2015/0270358 | A1 * | 9/2015 | Albarakaty | H01L 21/043 438/105 |
| 2015/0380343 | A1 * | 12/2015 | Koontz | H01L 23/562 257/621 |
| 2016/0320534 | A1 * | 11/2016 | Dodson | G02B 5/0858 |
| 2018/0331252 | A1 * | 11/2018 | Batres | H01L 21/30625 |
| 2019/0109024 | A1 * | 4/2019 | Deo | H01L 21/324 |
| 2019/0295918 | A1 * | 9/2019 | Trulli | F28F 21/02 |
| 2019/0313522 | A1 * | 10/2019 | Trulli | H01L 25/0655 |

OTHER PUBLICATIONS

Yun, Young et al., "Highly Miniaturized On-Chip Passive Components Fabricated by Microstrip Lines with Periodically Perforated Ground Metal on GaAs MMIC", IEEE, APMC, Proceedings, 2005.

Nishikawa, Kenjiro et al., "V-Band Fully-intergrated TX/RX Single-chip 3-D MMICs Using Commercial GaAs pHEMT Technology for High-Speed Wireless Applications", IEEE, GaAs Digest, 2003.

Chen, Andy C. et al., "Development of Low-Loss Broad-Band Planar Baluns Using Multilayered Organic Thin Films", IEEE, Transactions on Microwave Theory and Techniques, vol. 53, No. 11, Nov. 2005.

Xu, Zhan et al., "Optimum Design of Wideband Compensated and Uncompensated Marchand Baluns with Step Transformers", IEEE Transactions on Microwave Theory and Techniques, vol. 57, No. 8 Aug. 2009.

* cited by examiner

US 10,896,861 B2

HETEROGENEOUS MULTI-LAYER MMIC ASSEMBLY

BACKGROUND

A Monolithic Microwave Integrated Circuit (MMIC) device operates at microwave frequencies in the range of 300 MHz to 300 GHz. MMIC devices include microstrips, or microstrip circuits, to carry the microwave-frequency signals. A microstrip is an electrical transmission line that can be fabricated using printed circuit board technology and generally includes a conducting strip separated from a ground plane by a dielectric layer or substrate. A microstrip is less expensive to implement when compared with a waveguide, however, the microstrip generally has lower power handling capacity and higher losses and, because a microstrip is not enclosed, it is susceptible to cross-talk and unintentional radiation. Accordingly, MMIC designers need to design low-loss broad-band micro-strip circuits that will operate properly at these frequencies.

There are many known approaches to implementing micro-strip circuits. Decimated ground structures may be used to implement low-loss broad-band circuits, however, these are not compatible with grounded environments. Periodically perforated ground structures, where ground is brought to a topside of the MMIC through vias, provide a slow wave structure but not a low-loss circuit.

What is needed, therefore, is a better structure for providing low-loss micro-strip circuits.

SUMMARY

In one aspect of the present disclosure, there is a monolithic microwave integrated circuit (MMIC) assembly, comprising: a MMIC device having a device patterned ground plane layer; a device patterned circuit layer disposed on a first surface of the MMIC device; a thermal spreader coupled to the MMIC device; and a spreader ground plane disposed on the thermal spreader, wherein the device ground plane layer and the spreader ground plane are coupled to one another, wherein the thermal spreader comprises a dielectric material disposed therein, and wherein a portion of the device patterned circuit layer is adjacent a surface of the thermal spreader not covered by the spreader ground plane, whereby a low ground inductance is provided to the MMIC device.

In another aspect of the present disclosure, there is an integrated circuit (IC) assembly, comprising: a heat dissipation structure; a dissipation structure ground plane disposed on the dissipation structure; and an IC device, coupled to the dissipation structure, having a device patterned ground plane layer and a device patterned circuit layer disposed thereon, wherein the device ground plane layer and the dissipation structure ground plane are coupled to one another, wherein the thermal dissipation structure comprises a dielectric material, and wherein a portion of the device patterned circuit layer is adjacent a surface of the thermal dissipation structure not covered by the dissipation structure ground plane, whereby a low ground inductance is provided to the IC device.

BRIEF DESCRIPTION OF THE DRAWINGS

Various aspects of the disclosure are discussed below with reference to the accompanying figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, not every component may be labeled in every drawing. The Figures are provided for the purposes of illustration and explanation and are not intended as a definition of the limits of the disclosure. In the Figures.

DETAILED DESCRIPTION

Details are set forth in order to provide a thorough understanding of the aspects of the disclosure. It will be understood by those of ordinary skill in the art that these may be practiced without some of these specific details. In other instances, well-known methods, procedures, components and structures may not have been described in detail so as not to obscure the aspects of the disclosure.

MMICs that implement GaN-based transistors, and their related radio frequency (RF) power amplifiers, are becoming more prevalent as this technology replaces traveling wave tubes in radar, electronic warfare (EW) systems and satellite communications. The GaN high electron mobility transistors (HEMTs) on silicon carbide, however, generate a lot of heat in very small areas typically measured in microns, i.e., densities greater than 1 kW/cm$^2$. Micro-channel and micro-jet heat sinks can dissipate high heat fluxes in high power electronic devices and metallized chemical vapor deposition (CVD) diamond heat spreaders are also often used to dissipate the concentrated heat flux.

Generally, and as will be described in more detail below, aspects of the present disclosure are directed to combining a thermal spreader in conjunction with a monolithic semiconductor circuit to provide multiple levels of metal separated by multiple dielectric layers that enable the MMIC designer to create low-loss, broad-band microstrip circuits. The thermal spreader may include patterned diamond, a metal spreader with an air/wire-edm cavity in one or more predetermined locations, or a multi-layer board (PCB) with heat sink/ground vias in one or more predetermined areas under the MMIC.

Figure 1A:
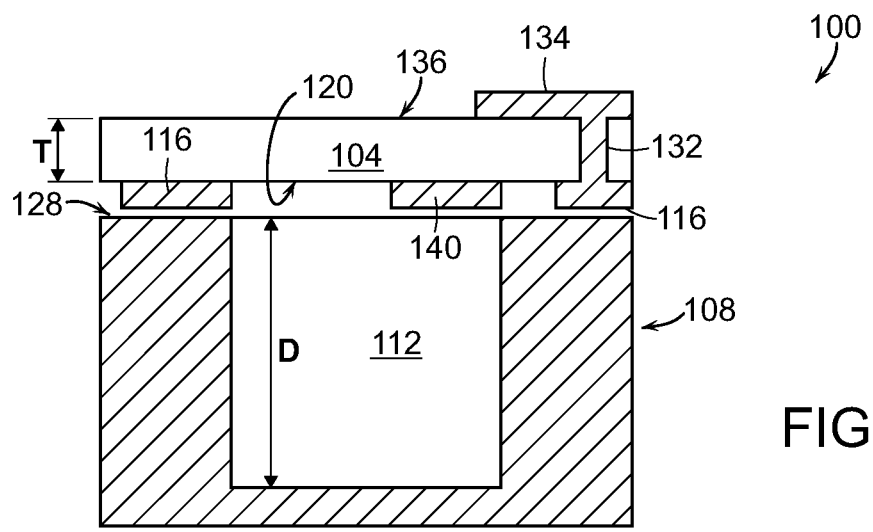
FIGS. 1A and 1B represent a MMIC assembly in accordance with an aspect of the present disclosure.
Figure 1B:
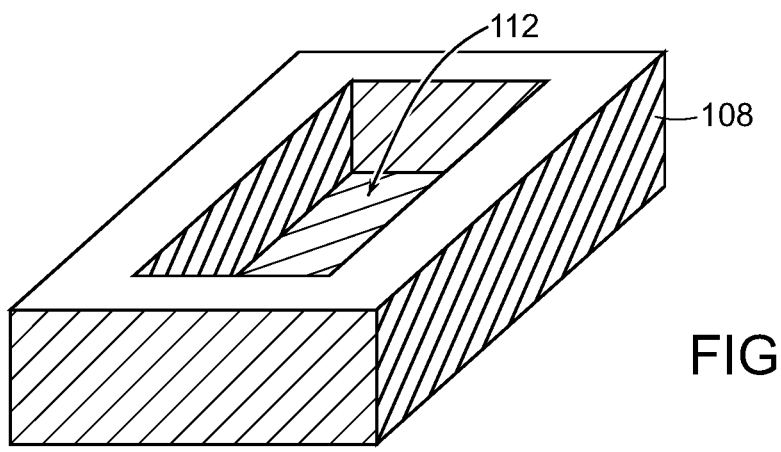

Referring now to FIGS. 1A and 1B, in one aspect of the present disclosure, a multi-layer MMIC assembly 100 includes a MMIC 104 interfacing with a metal spreader 108 having at least one cavity or opening 112 in the metal that is, in one non-limiting example, a depth D≈40 mils, and a dielectric value er≈1. The MMIC 104, in a non-limiting example, may be a Raytheon RF Components (RRFC) MMIC with GaN/GaAs technology, having a thickness T≈4 mils and a dielectric value er≈10. A first MMIC patterned ground plane 116 made from, for example, laser ablated (or patterned) gold, is provided on a first surface 120, i.e., a bottom surface, of the MMIC 104.

The metal spreader 108 also serves as the ground plane when coupled to the ground plane 116. The metal spreader 108 and the first MMIC patterned ground plane 116 will "self-align" with one another when solder provided between the two is wetted, i.e., self-aligning/self-assembly occurs with a natural "etch stop" where gold is not present. If necessary, self-aligning structures may be placed on either or both the MMIC 104 and the metal spreader 108 to ensure proper alignment.

The FETs in the MMIC 104 are coupled to the metal spreader 108. One or more vias 132 on the MMIC 104 bring ground to a topside ground plane 134 on a top surface 136 and the bottom surface 120 of the MMIC 104 from the metal spreader 108. In addition, there is also provided a back side metal layer 140 on the first surface 120 that is not grounded, i.e., not connected to the metal spreader 108. Advantageously, the non-grounded metal layer 140 between the metal spreader 108 and the body of the MMIC 104 allows for the implementation of new circuit topologies.

Figure 2:
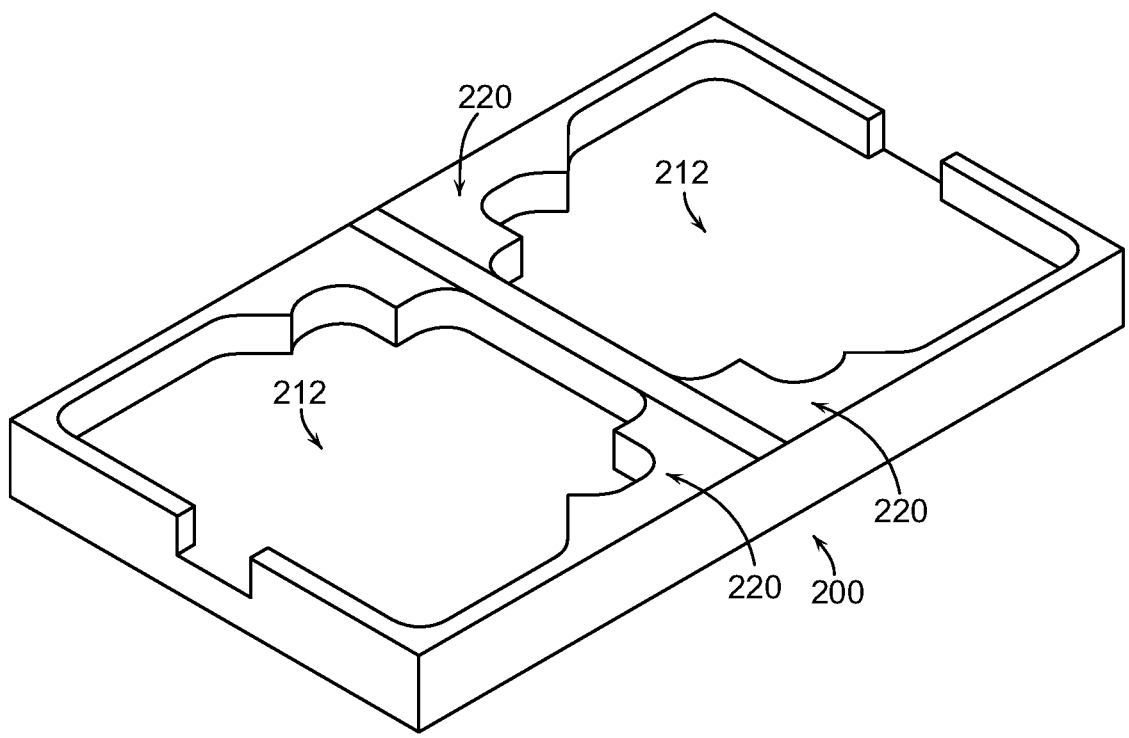
FIG. 2 is a perspective view of a metal spreader in accordance with an aspect of the present disclosure.

FIG. 2 is a perspective view of a metal spreader 200, having an air cavity 212 defined therein. A plurality of surface areas 220 are provided to contact corresponding portions of the underside of the MMIC device where the heat producing FETs are located.

Figure 3A:
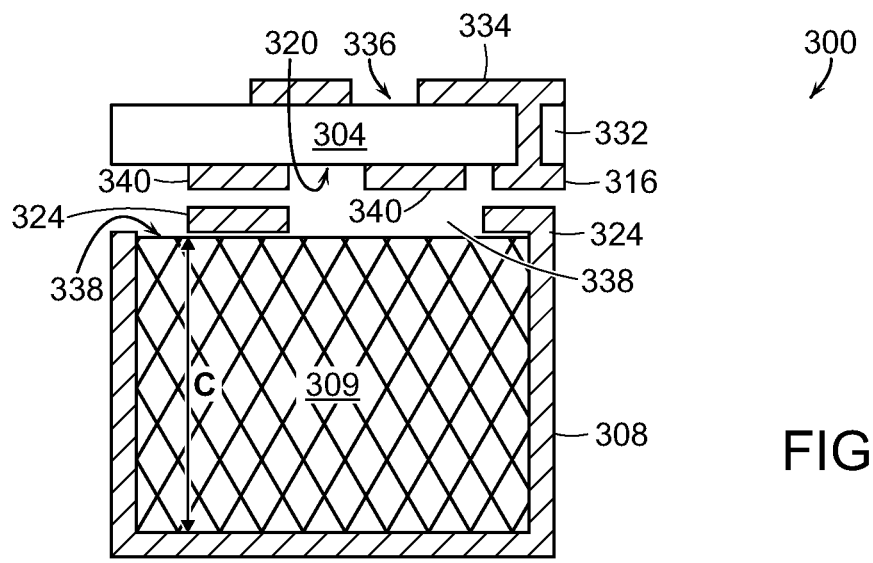
FIGS. 3A and 3B represent a MMIC assembly in accordance with an aspect of the present disclosure.
Figure 3B:
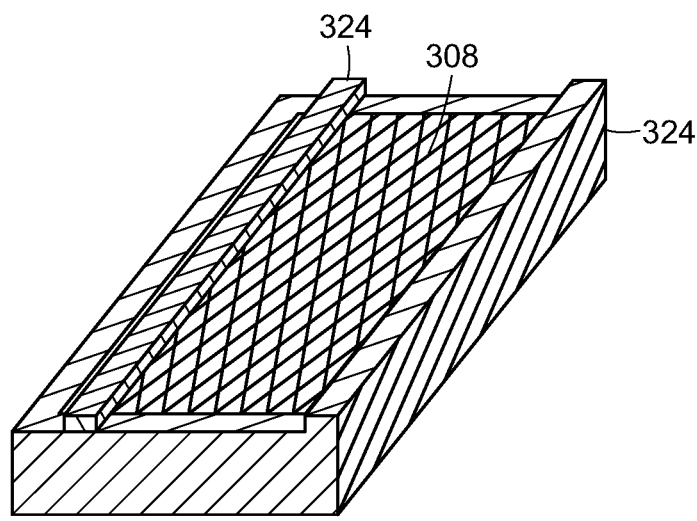

Referring now to FIGS. 3A and 3B, in another aspect of the present disclosure, a multi-layer MMIC assembly 300 includes a MMIC 304 interfacing with a diamond heat spreader 308 including CVD diamond material 309 with a depth C≈40 mil and er≈5.6. The MMIC 304, in a non-limiting example, may be the RRFC MMIC referenced above. A first MMIC patterned ground plane 316 made from, for example, laser ablated (or patterned) gold, is provided on a first surface 320, i.e., a bottom surface, of the MMIC 304.

A first diamond spreader patterned ground plane 324, for example, made from laser ablated (or patterned) gold, corresponding to the first MMIC patterned ground plane 316 is provided around the diamond heat spreader 308 and onto at least a portion of a first surface 338, i.e., a top surface, of the diamond heat spreader 308. The patterned ground plane 324 also serves as the ground plane when coupled to the ground plane 316. The first spreader patterned ground plane 324 and the first MMIC patterned ground plane 316 will "self-align" with one another when solder provided between the two is wetted, i.e., self-aligning/self-assembly occurs with a natural "etch stop" where gold is not present. If necessary, self-aligning structures may be placed on either or both the MMIC and spreader to ensure proper alignment.

The FETs in the MMIC 304 are coupled to the ground plane 324 on the diamond heat spreader 308. One or more vias 332 on the MMIC 304 bring ground to a topside ground plane 334 on a top surface 336 and the bottom surface 320 of the MMIC 304 from the ground plane 324 on the diamond heat spreader 308. In addition, there is also provided a back side metal layer 340 on the first surface 320 that is not grounded, i.e., not connected to the diamond heat spreader 308. Advantageously, the non-grounded metal layer 340 between the diamond heat spreader 308 and the body of the MMIC 304 allows for the implementation of new circuit topologies. The metal layer 340 may or may not be in contact with the metal layer 324 on the surface 338 of the diamond spreader 308 in accordance with desired circuit design parameters.

Figure 4A:
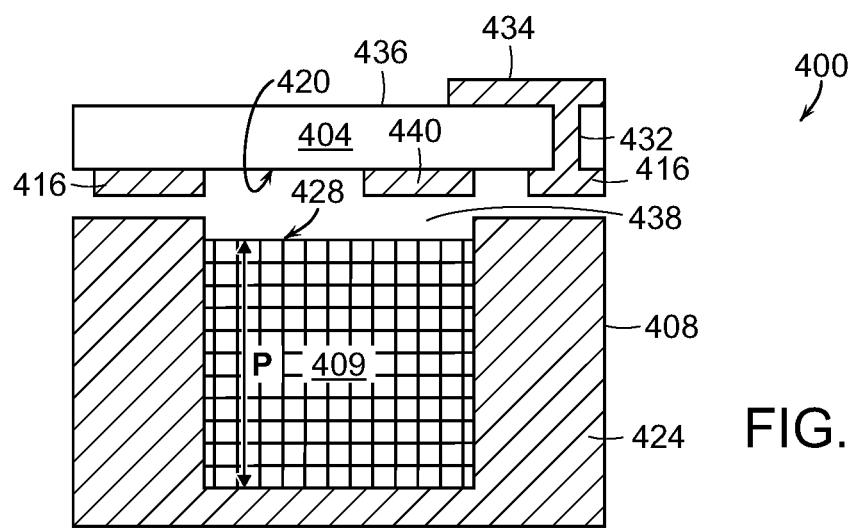
FIGS. 4A and 4B represent a MMIC assembly in accordance with an aspect of the present disclosure.
Figure 4B:
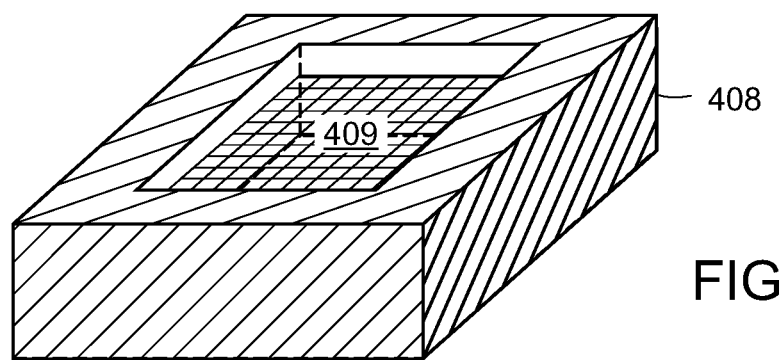

Referring now to FIGS. 4A and 4B, in another aspect of the present disclosure, a multi-layer MMIC assembly 400 includes a MMIC 404 interfacing with a multi-layer board (MLB) 408 with heat sink vias and ground vias with a depth P that varies with the number of layers. The MMIC 404, in a non-limiting example, may be the RRFC MMIC referenced above. A first MMIC patterned ground plane 416 made from, for example, laser ablated (or patterned) gold, is provided on a first surface 420, i.e., a bottom surface, of the MMIC 404.

A heat sink/ground via 424 in the MLB 408 made from, for example, plated (or patterned) gold, corresponding to the first MMIC patterned ground plane 416 is provided in specified locations around the MLB 408 and onto at least a portion of a first surface 428, i.e., a top surface, of the MLB 408. The MLB via grounds 424 and the first MMIC patterned ground plane 416 will "self-align" with one another when solder provided between the two is wetted, i.e., self-aligning/self-assembly occurs with a natural "etch stop" where gold is not present. If necessary, self-aligning structures may be placed on either or both the MMIC 404 and the MLB 408 to ensure proper alignment.

As an alternative to soldering the MMIC 404 to the MLB 404, a combination of conductive and non-conductive epoxy can be used. The conductive epoxy can be applied in those regions of the MLB 408 where the thermal/ground vias are located and the non-conductive epoxy can be placed in regions of the MLB 408 where there are no thermal/ground vias.

The FETs in the MMIC 404 are coupled to the MLB patterned ground 424 of the MLB 408. One or more vias 432 on the MMIC 404 bring ground to a topside ground plane 434 on a top surface 436 and the bottom surface 420 of the MMIC 404 from the MLB spreader 408. In addition, there is also provided a back side metal layer 440 on the first surface 420 that is not grounded, i.e., not connected to the MLB 408. Advantageously, the non-grounded metal layer 440 between the MLB 408 and the body of the MMIC 404 allows for the implementation of new circuit topologies.

The openings 438, i.e., portions where there is no gold deposited, in the MLB via ground 424 of the MLB spreader 408 provide an MLB dielectric (er≈2) to ground.

It is to be understood that the disclosure is not limited in its application to the details of construction and the arrangement of the components set forth herein or illustrated in the drawings as it is capable of implementations or of being practiced or carried out in various ways. Also, it is to be understood that the phraseology and terminology employed herein are for the purpose of description only and should not be regarded as limiting.

Certain features, which are, for clarity, described in the context of separate implementations, may also be provided in combination in a single implementation. Conversely, various features, which are, for brevity, described in the context of a single implementation, may also be provided separately or in any suitable sub-combination.

The present disclosure is illustratively described in reference to the disclosed implementations. Various modifications and changes may be made to the disclosed implementations by persons skilled in the art without departing from the scope of the present disclosure as defined in the appended claims.

What is claimed is:

1. A monolithic microwave integrated circuit (MMIC) assembly, comprising:
   a MMIC device, having a device patterned ground plane layer, the MMIC device generating a heat profile across the device patterned ground plane layer during operation;
   a device patterned circuit layer disposed on a first surface of the MMIC device;
   a thermal spreader coupled to the MMIC device; and
   a spreader ground plane disposed on the thermal spreader, the spreader ground plane having a shape corresponding to the heat profile of the MMIC device and which comprises a plurality of surface areas corresponding to heat producing components of the MMIC device, wherein the device patterned ground plane layer and the spreader ground plane are coupled to one another, wherein the thermal spreader comprises a dielectric material disposed therein, and wherein a portion of the device patterned circuit layer is adjacent a surface of the thermal spreader not covered by the spreader ground plane, whereby a low ground inductance is provided to the MMIC device.

2. The assembly of claim 1, wherein each of the device ground plane layer and the spreader ground plane comprises a conductive material.

3. The assembly of claim 2, wherein the conductive material comprises gold.

4. The assembly of claim 1, wherein:

the thermal spreader comprises a metal with a cavity defined therein, and wherein air in the cavity is the dielectric.

5. The assembly of claim 4, wherein the portion of the device patterned circuit layer is adjacent the air cavity.

6. The assembly of claim 1, wherein:

the thermal spreader comprises diamond material, wherein the spreader ground plane is disposed around an outer surface of the thermal spreader, and wherein the diamond material is the dielectric.

7. The assembly of claim 1, wherein:

the thermal spreader comprises a multi-layer board assembly, and wherein the spreader ground plane is disposed around an outer surface of the multi-layer board assembly.

8. The assembly of claim 7, wherein the portion of the device patterned circuit layer is adjacent the multi-layer board assembly.

9. The assembly of claim 7, wherein the multi-layer board assembly comprises a plurality of board layers with heat sink vias and ground vias therebetween.

* * * * *